(12) United States Patent
Lin et al.

(10) Patent No.: US 8,359,745 B2
(45) Date of Patent: Jan. 29, 2013

(54) METHOD FOR MANUFACTURING A HEAT SINK

(75) Inventors: Kuo-Len Lin, Wugu Township, Taipei County (TW); Chen-Hsiang Lin, Wugu Township, Taipei County (TW); Ken Hsu, Wugu Township, Taipei County (TW); Chih-Hung Cheng, Wugu Township, Taipei County (TW)

(73) Assignees: CPUmate Inc., New Taipei (TW); Golden Sun News Techniques Co., Ltd., New Taipei (TW)

( * ) Notice: Subject to any disclaimer, the term of this patent is extended or adjusted under 35 U.S.C. 154(b) by 759 days.

(21) Appl. No.: 12/511,195

(22) Filed: Jul. 29, 2009

(65) Prior Publication Data

US 2011/0024088 A1 Feb. 3, 2011

(51) Int. Cl.
*B23P 15/26* (2006.01)
(52) U.S. Cl. ......... 29/890.046; 29/890.032; 29/890.038; 29/890.03; 29/890.045; 29/890.035; 165/104.33; 361/697
(58) Field of Classification Search ............. 29/890.046, 29/890.032, 890.038, 890.03, 890.045, 890.035; 165/181, 104.21, 80.4, 104.14, 133, 80.3, 165/185, 110, 104.33; 361/697, 700
See application file for complete search history.

(56) References Cited

U.S. PATENT DOCUMENTS

| | | | | |
|---|---|---|---|---|
| 3,189,087 | A * | 6/1965 | Parris | 165/181 |
| 7,215,548 | B1 | 5/2007 | Wu et al. | |
| 7,254,026 | B2 * | 8/2007 | Yang et al. | 361/703 |
| 2005/0183846 | A1 | 8/2005 | Mok | |
| 2007/0089869 | A1 | 4/2007 | Hwang et al. | |
| 2008/0283234 | A1 | 11/2008 | Sagi et al. | |

FOREIGN PATENT DOCUMENTS

JP 2-211657 A 8/1990

OTHER PUBLICATIONS

European research report dated Jan. 18, 2010.

\* cited by examiner

*Primary Examiner* — Richard Chang
(74) *Attorney, Agent, or Firm* — Chun-Ming Shih; HDLS IPR Services

(57) ABSTRACT

A method for manufacturing a heat sink includes providing a heat-conducting base with a plurality of open troughs; providing a plurality of heat pipes, each having a heat-absorbing section and a heat-releasing section extending from the heat-absorbing section; the heat-absorbing section being accommodated in one open trough to have the heat pipe engaged with the heat-conducting base; providing a plurality of heat-dissipating fins, each of the heat-dissipating fins having a lower plate and an upper plate extending from the lower plate, the upper plate being folded to form an overlapping portion attached on the lower plate; forming a through-hole in the lower plate and the upper plate at the overlapping portion; and penetrating the through-holes of the heat-dissipating fins by the heat-releasing section of the heat pipe. In this way, the heat-dissipating area in the same height can be increased, thereby improving the heat-dissipating efficiency of the heat sink.

3 Claims, 12 Drawing Sheets

METHOD FOR MANUFACTURING A HEAT SINK

BACKGROUND OF THE INVENTION

1. Field of the Invention

The present invention relates to a heat-dissipating fin, a heat sink and a method for manufacturing the same, and in particular to a heat-dissipating fin capable of increasing heat-dissipating area, a heat sink having such heat-dissipating fins, and a method for manufacturing the same.

2. Description of Prior Art

A common heat sink usually includes a heat-conducting base, a plurality of heat pipes and a plurality of heat-dissipating fins. The heat-conducting base is adhered to a heat-generating electronic element. The heat pipe includes a heat-absorbing section and two heat-releasing sections extending from both ends of the heat-absorbing section. Such kind of heat pipe is usually formed into U shape. The heat-absorbing section is inserted into the heat-conducting base, while the heat-releasing section penetrates the respective heat-dissipating fins. The heat generated by the heat-generating electronic element is first conducted to the heat-conducting base. Then, the heat-conducting base conducts the heat to the heat pipe. Finally, the heat pipe conducts the heat to the heat-dissipating fins. The heat is dissipated to the ambient air from the surfaces of the heat-dissipating fins.

However, in practice, such a heat sink still has some problems. Since the heat pipe in such a heat sink is formed into U shape and the heat-dissipating fins are penetrated directly by the heat pipe, the central portion of each heat-dissipating fin is located farther from the heat-releasing section of the heat pipe. As a result, this portion of each heat-dissipating fin is poor in heat-dissipating efficiency. Further, the waste heat generated by the heat-generating electronic element will be accumulated in the heat-conducting base, which affects the heat-dissipating efficiency of the whole heat sink.

Therefore, it is an important issue for the present Inventor to solve the above-mentioned problems.

SUMMARY OF THE INVENTION

The present invention is to provide a heat sink having heat-dissipating fins capable of increasing heat-dissipating area, and a method for manufacturing the same. Each of the heat-dissipating fins is bent to be overlapped with each other, whereby the density of the heat-dissipating fins can be increased in a limited space. Further, in this way, the heat-dissipating area of each heat-dissipating fin can be increased, so that the heat-dissipating efficiency of the whole heat sink can be enhanced.

The present invention is to provide a heat-dissipating fin capable of increasing heat-dissipating area, which includes a lower plate and an upper plate. The lower plate is provided with a through-hole. The upper plate extends from the lower plate and is bent to be overlapped on the lower plate, thereby forming a heat-dissipating path there between.

The present invention provides a heat sink having heat-dissipating fins capable of increasing heat-dissipating area, which includes a heat pipe and a plurality of heat-dissipating fins. The heat pipe has a heat-absorbing section and a heat-releasing section extending from the heat-absorbing section. The heat-dissipating fin has a lower plate and an upper plate extending from the lower plate. The upper plate is bent to be overlapped on the lower plate, thereby forming a heat-dissipating path there between. The lower plate and the upper plate are provided with a through-hole respectively in such a manner that these two through-holes correspond to each other. The heat-releasing section of the heat pipe penetrates the through-holes of the heat-dissipating fins successively.

The present invention provides a method for manufacturing the heat sink having heat-dissipating fins capable of increasing heat-dissipating area, including the steps of: a) providing a heat-conducting base and a heat pipe; b) inserting the heat pipe into the heat-conducting base; c) providing a plurality of heat-dissipating fins, each of the heat-dissipating fins having a lower plate and an upper plate extending from the lower plate, the upper plate being bent to be overlapped on the lower plate; d) forming a through-hole in the lower plate and the upper plate respectively in such a manner that these two through-holes correspond to each other; and e) penetrating the through-holes of the heat-dissipating fins by the heat pipe.

In comparison with prior art, the present invention has advantageous effects as follows. The density of the heat-dissipating fins is increased in a limited space, so that the heat-dissipating area is increased accordingly. Further, each of the heat-dissipating fins can extend outwards and laterally according to practical demands. A heat-dissipating body can be further adhered to the heat-conducting base so as to increase the heat-conducting efficiency of the heat-conducting base. Further, the bottom of the heat-absorbing section of the heat pipe is a flat surface, so that it is in flush with the bottom of the heat-conducting base. In this way, such a heat sink can be adhered to a heat-generating electronic element more tightly so as to increase the heat-conducting efficiency.

DETAILED DESCRIPTION OF THE INVENTION

Figure 1:
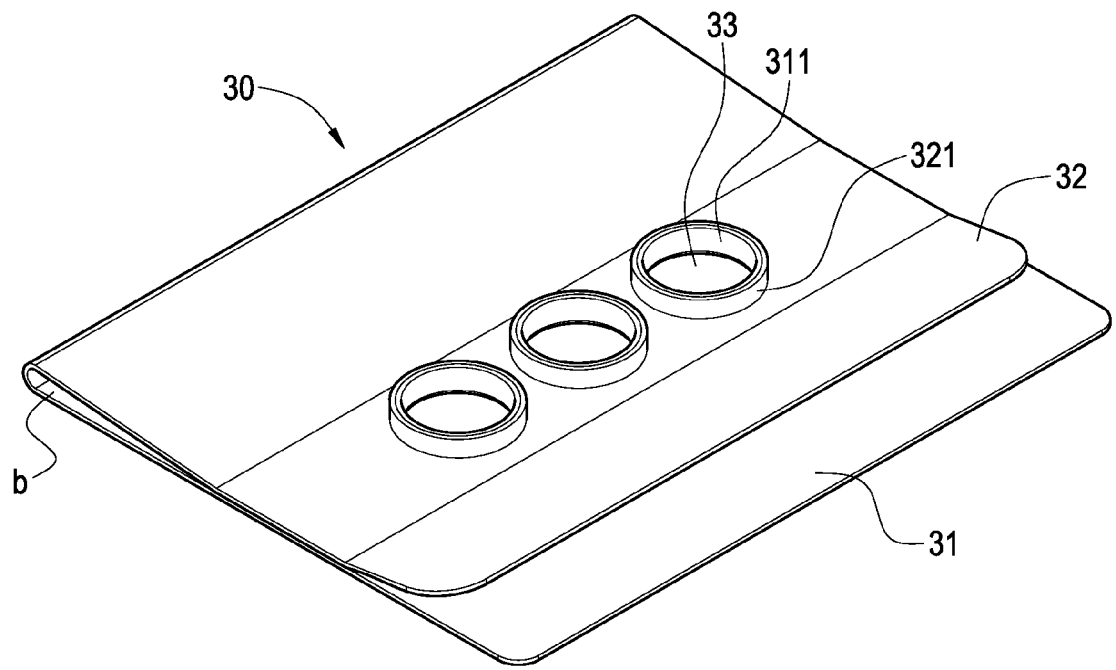
FIG. 1 is a perspective view showing the external appearance of the heat-dissipating fin of the present invention.
Figure 2:
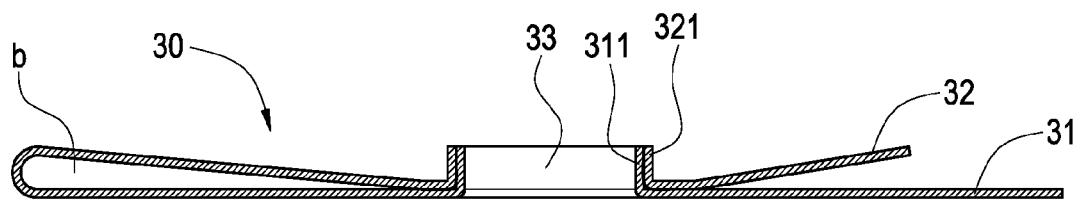
FIG. 2 is a side view of the heat-dissipating fin of the present invention.
Figure 3:
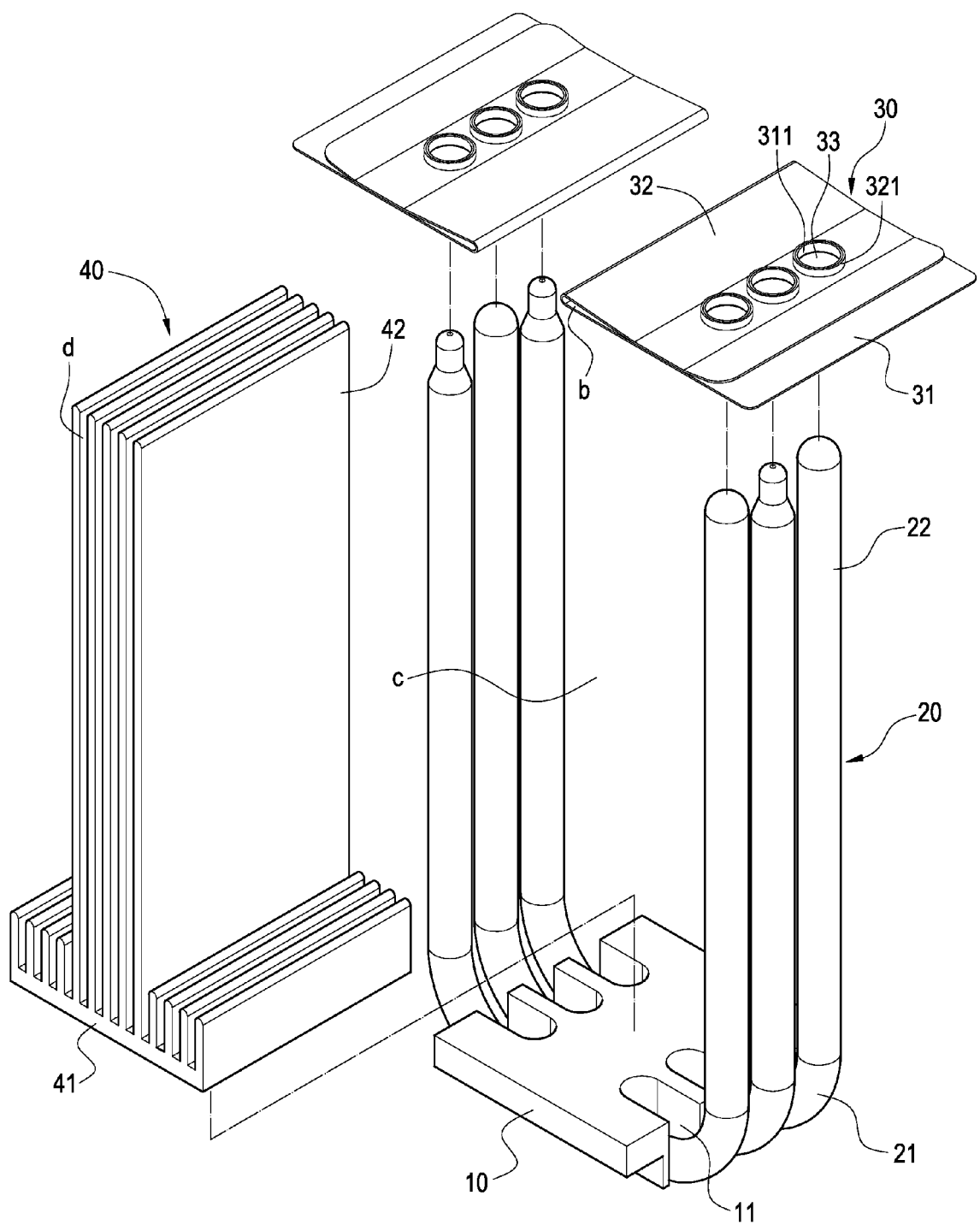
FIG. 3 is an exploded perspective view of the present invention.

The characteristics and technical contents of the present invention will be explained in more detail with reference to the accompanying drawings. However, the drawings are illustrative only but not used to limit the present invention.

Please refer to FIGS. 1 to 3. FIG. 1 is a perspective view showing the external appearance of the heat-dissipating fin of the present invention. FIG. 2 is a side view of the heat-dissipating fin of the present invention. FIG. 3 is an exploded perspective view of the present invention. The present invention provides a heat sink 1 having heat-dissipating fins capable of increasing heat-dissipating area, which includes a heat-conducting base 10, plurality of heat pipes 20, a plurality of heat-dissipating fins 30 and a heat-dissipating body 40.

The bottom of the heat-conducting base 10 is provided with a plurality of open troughs 11. The heat-conducting base 10 is adhered to a heat-generating electronic element (not shown). In the present embodiment, the number of the heat pipe 20 is three, but it is not limited thereto.

Figure 6:
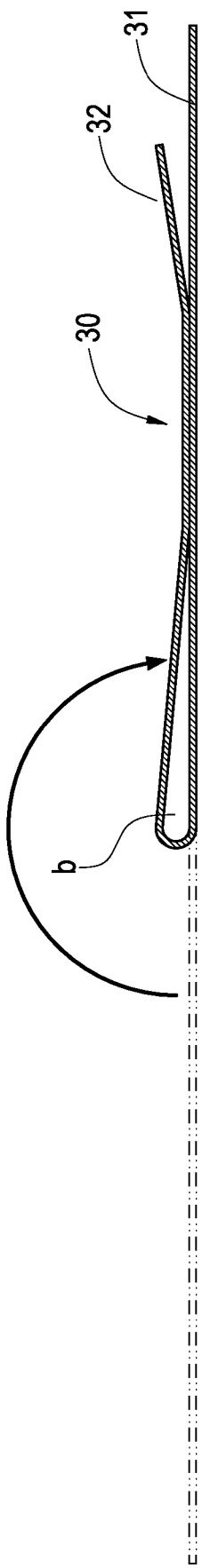
FIG. 6 is a schematic view (I) showing the manufacture of the heat-dissipating fin of the present invention.

The heat pipe 20 has a heat-absorbing section 21 and two heat-releasing sections 22 formed by bending and extending from both ends of the heat-absorbing section 21, so that the heat pipe 20 is formed into U shape. Further, an accommodating space c is formed between the two heat-releasing sections 22. The heat-absorbing section 21 is accommodated in the open trough 11 and inserted into the heat-conducting base 10. Further, as shown in FIG. 6, the bottom of the heat-absorbing section 21 is formed into a flat surface that is in flush with the bottom of the heat-conducting base 10. In this way, the heat sink 1 can be adhered to the heat-generating electronic element (not shown) more tightly, thereby achieving a better heat-conducting efficiency.

The heat-dissipating fin 30 has a lower plate 31 an upper plate 32 extending from the lower plate 31. The upper plate 32 is bent to be overlapped on the lower plate 31, thereby forming a heat-dissipating path b there between. The lower plate 31 and the upper plate 32 are provided with a through-hole 33 respectively in such a manner that these two through-holes correspond to each other. The heat-releasing sections 22 of the heat pipe 20 penetrate the through-holes 33 of the heat-dissipating fins 30 successively.

The periphery of the through-hole 33 is formed with an inner annular wall 311 extending from the lower plate 31 and an outer annular wall 321 extending from the upper plate 32. The inner annular wall 311 is adhered to the outer annular wall 321. The inner annular wall 311 is brought into thermal contact with the heat-releasing section 22 of the heat pipe 20.

The heat-dissipating body 40 is adhered to the heat-conducting base 10 and is disposed among the heat-dissipating fins 30. That is, the heat-dissipating body 30 is disposed in the accommodating space c. The heat-dissipating body 40 has a base 41 brought into thermal contact with the heat-conducting base 10 and a plurality of extension pieces 42 extending upwards from the base 41. The extension pieces 42 are arranged at intervals, thereby forming an airflow path d between any two extension pieces 42.

Figure 4:
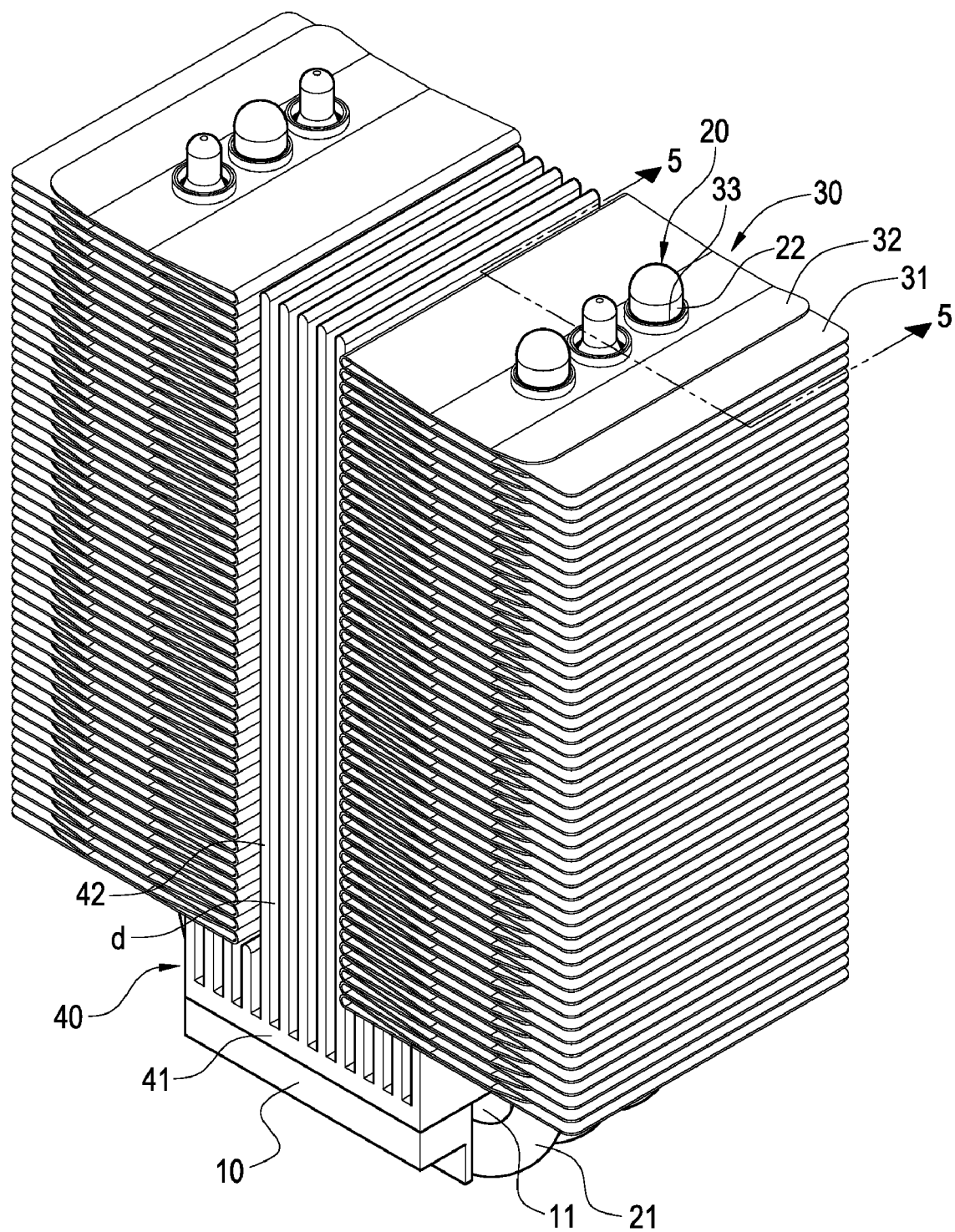
FIG. 4 is an assembled perspective view of the present invention.
Figure 5:
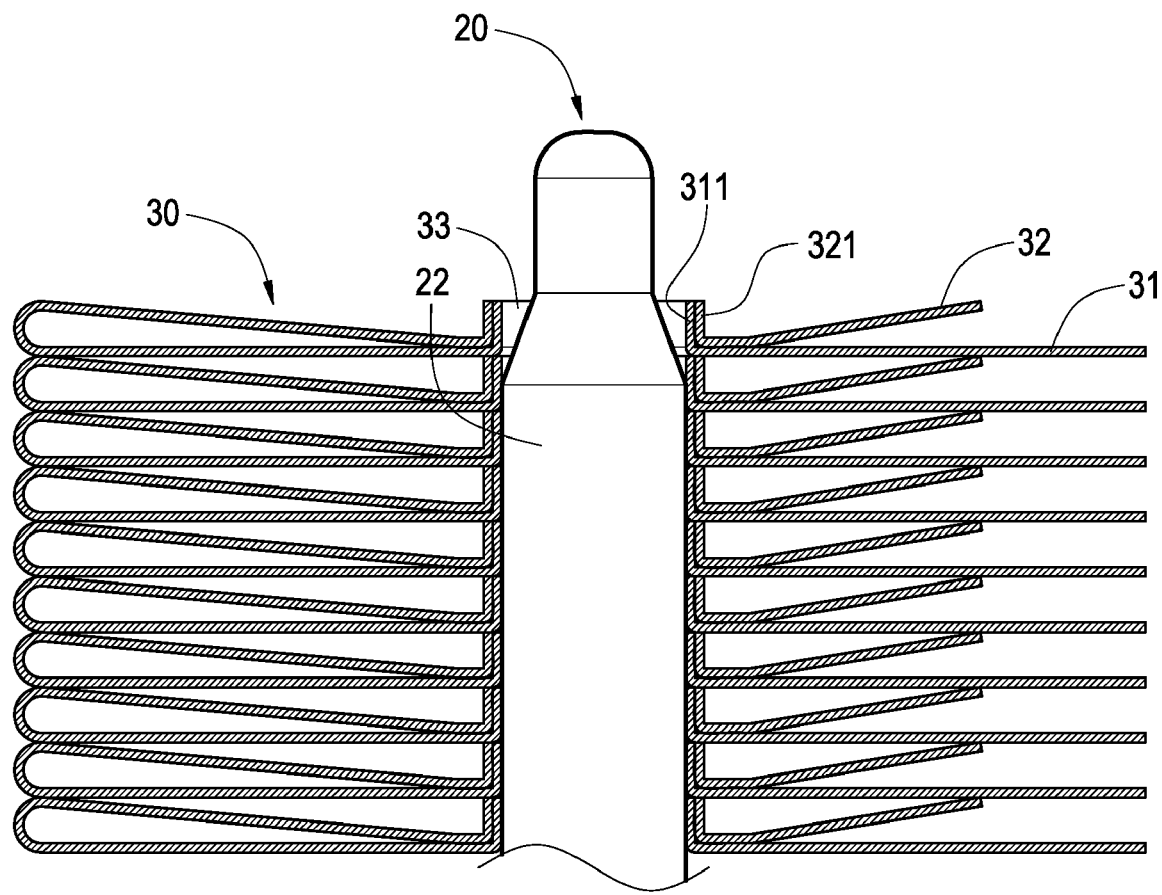
FIG. 5 is a partially cross-sectional view taken along the line 5-5 in FIG. 4.

Please refer to FIGS. 4 and 5. FIG. 4 is an assembled perspective view of the present invention, and FIG. 5 is a partially cross-sectional view taken along the line 5-5 in FIG. 4. As shown in FIG. 4, the heat-releasing sections 22 of the heat pipe 20 penetrate the heat-dissipating fins 30. According to the practice demands, the dimension of the upper plate 32 or the lower plate 31 can be varied. For example, the upper plate 32 or the lower plate 31 may extend laterally so as to increase the heat-dissipating area.

Figure 7:
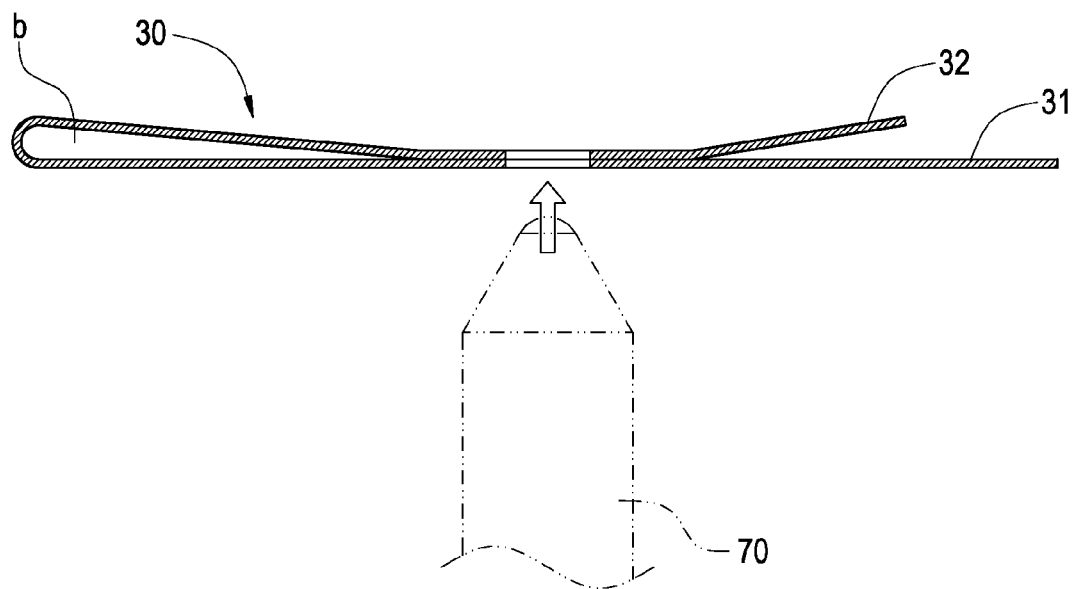
FIG. 7 is a schematic view (II) showing the manufacture of the heat-dissipating fin of the present invention.
Figure 8:
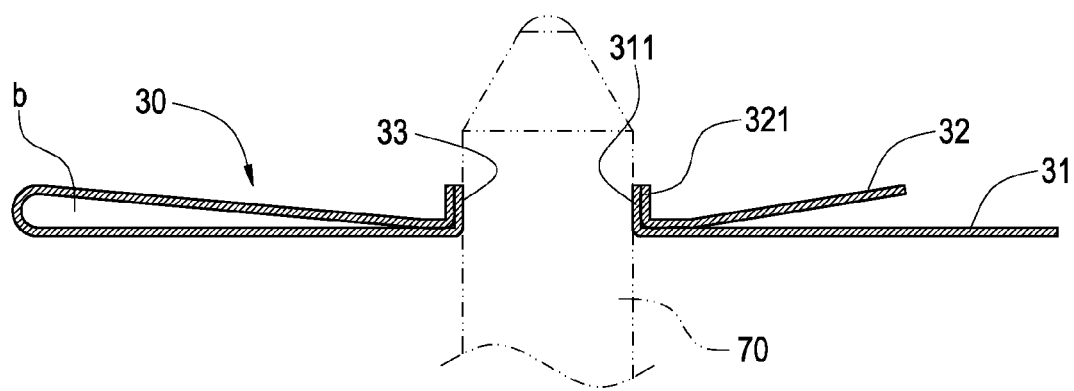
FIG. 8 is a schematic view (III) showing the manufacture of the heat-dissipating fin of the present invention.

Please refer to FIGS. 6 to 8. FIG. 6 is a schematic view (I) showing the manufacture of the heat-dissipating fin of the present invention. FIG. 7 is a schematic view (II) showing the manufacture of the heat-dissipating fin of the present invention. FIG. 8 is a schematic view (III) showing the manufacture of the heat-dissipating fin of the present invention. First, the upper plate 32 is folded to be overlapped on the lower plate 31. Then, the upper plate 32 and the lower plate 31 are processed to have a through-hole 33 respectively in such a manner that these through-holes correspond to each other. Finally, a forming tool is used to process the upper plate 32 and the lower plate 31 to make them form respectively an inner annular wall 311 and an outer annular wall 321 adhered to the inner annular wall 311.

Figure 9:
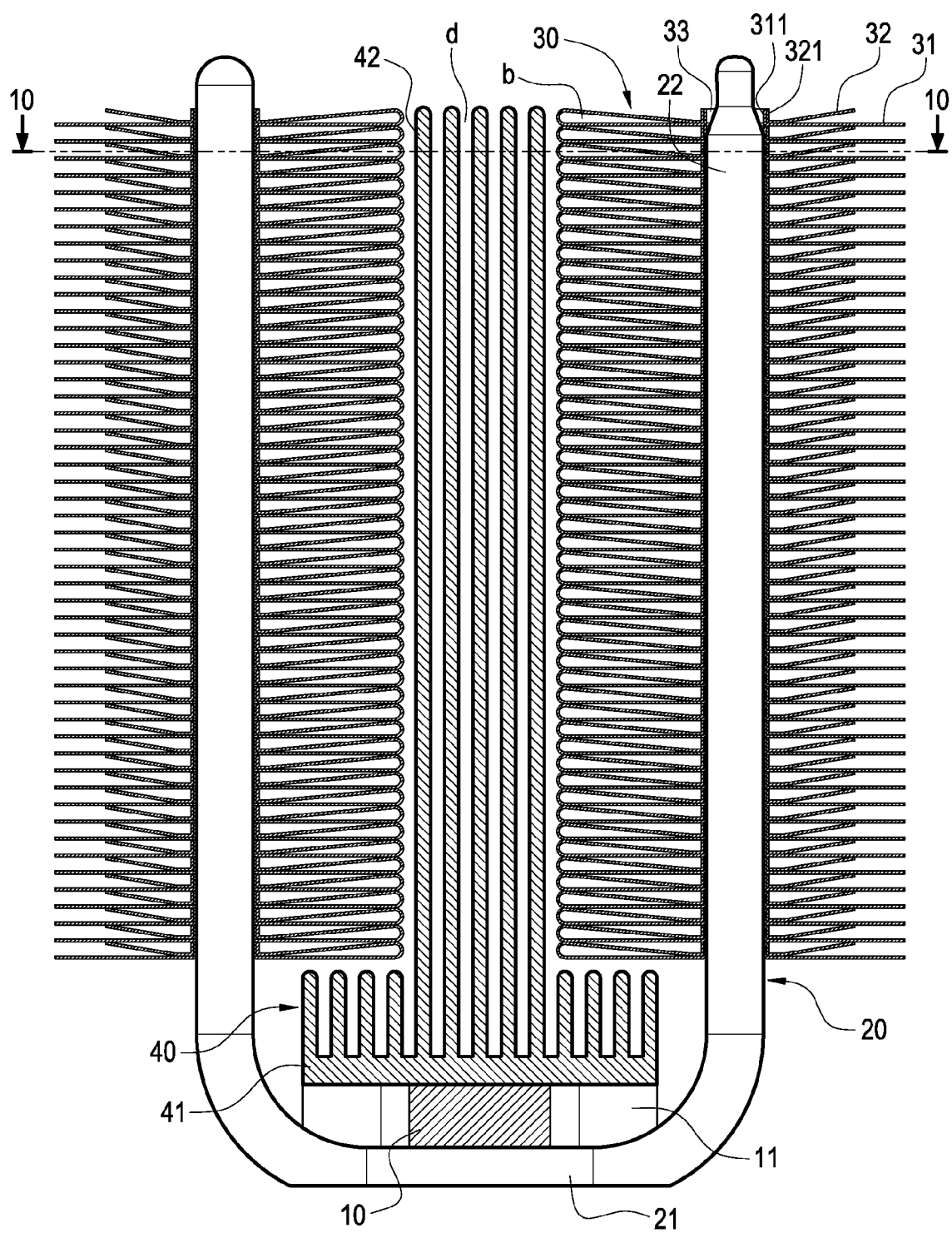
FIG. 9 is side cross-sectional view of the present invention.
Figure 10:
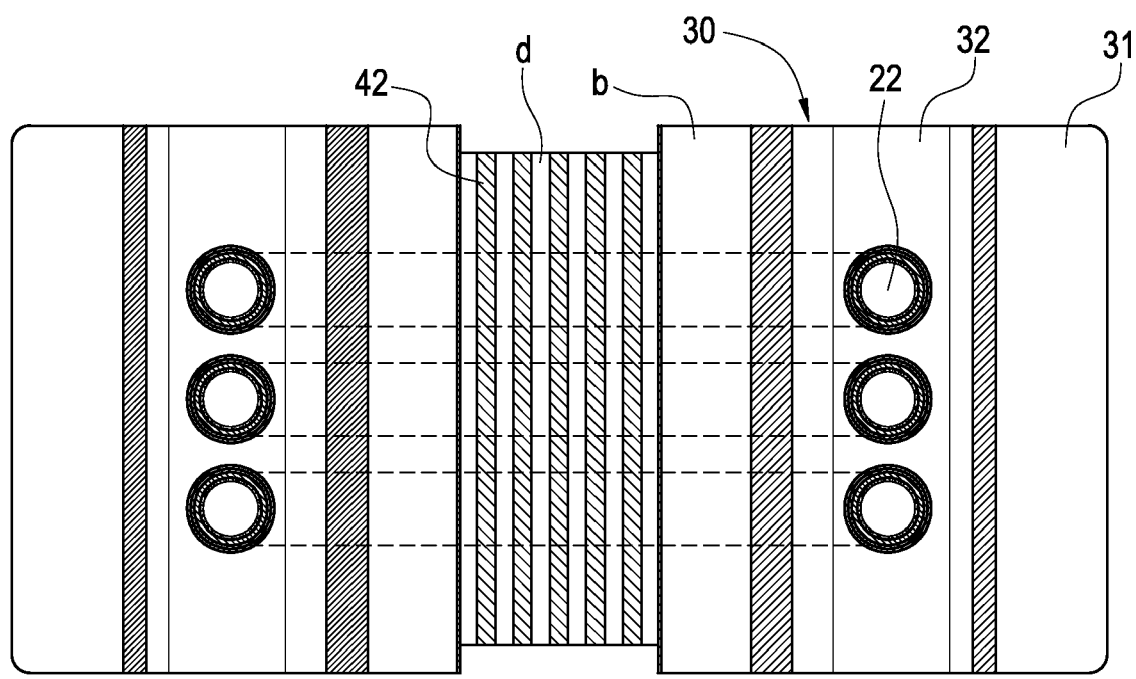
FIG. 10 is a cross-sectional view taken along the line 10-10 in FIG. 9.
Figure 11:
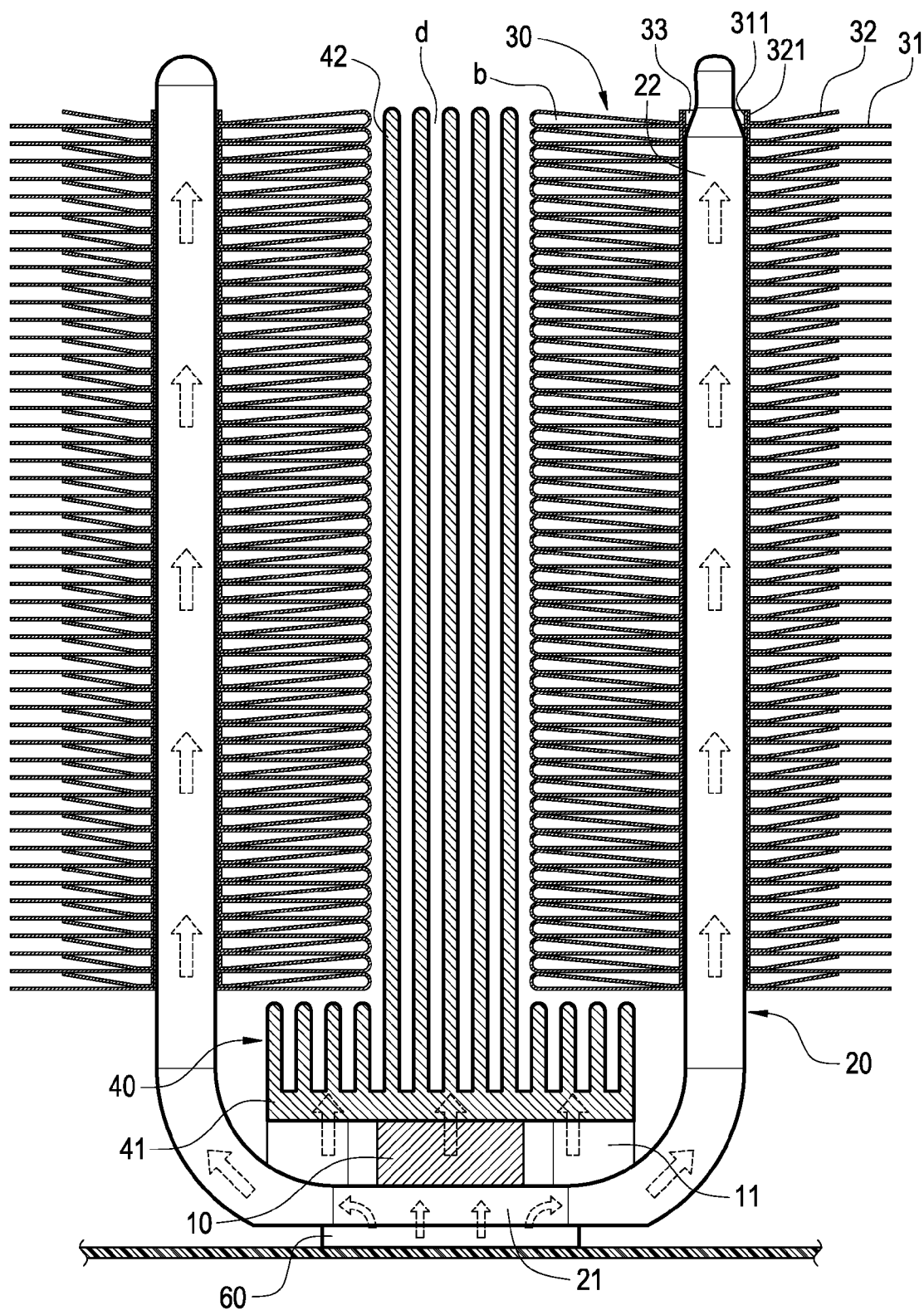
FIG. 11 is side cross-sectional view showing the operating state of the present invention.

Please refer to FIGS. 9 to 11. FIG. 9 is side cross-sectional view of the present invention. FIG. 10 is side cross-sectional view showing the operating state of the present invention. FIG. 11 is side cross-sectional view showing the operating state of the present invention. As shown in FIG. 9, the extension pieces 42 extend upwards from the base 41 and are disposed in the accommodating space c between the heat-dissipating fins 30 on both sides. With this arrangement, the heat of the heat-conducting base 10 not only can be conducted by the heat pipe 20, but also can be dissipated by the extension piece 42 of the heat-dissipating body 40. Thus, the heat-dissipating efficiency can be increased.

As shown in FIG. 10, the upper plate 31 or the lower plate 32 of the heat-dissipating fin 30 can be extended or expanded in the horizontal direction according to the practical demands, thereby increasing the heat-dissipating efficiency.

As shown in FIG. 11, the bottom of the heat-conducting base 10 and the bottom of the heat-absorbing section 21 are adhered to a surface of a heat-generating electronic element 60. The direction indicated by the arrows in this figure is the direction of conducting the waste heat generated by the electronic element 60. The waste heat can be conducted from the heat-absorbing section 21 of the heat pipe 20 to the heat-releasing sections 22. Then, the heat is conducted to the heat-dissipating fins 30. Finally, the heat is dissipated to the air from the surfaces of the heat-dissipating fins 30 to complete the heat dissipation.

Alternatively, the waste heat generated by the electronic element 60 is conducted to the heat-conducting base 10. Then, the heat is conducted from the heat-conducting base 10 to the surfaces of the extension pieces 42 of the heat-dissipating body 40. Finally, the heat is taken away by flowing air to complete the heat dissipation. With the combination of these two heat-dissipating mechanisms, the heat-conducting efficiency of the heat sink 1 can be improved.

Figure 12:
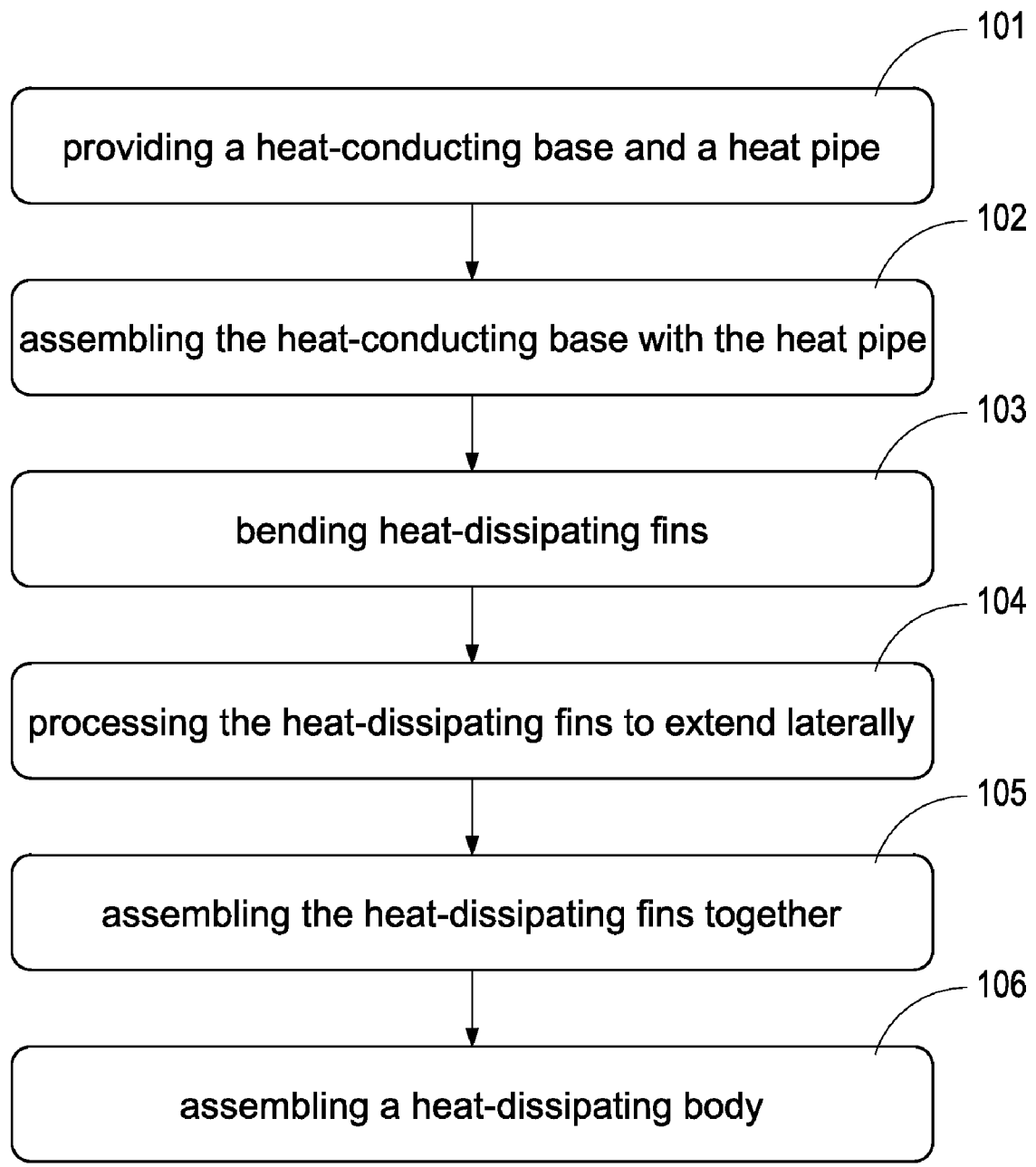
FIG. 12 is a flow chart showing the manufacturing method of the present invention.

Please refer to FIG. 12, which is a flow chart showing the method of the present invention. The present invention provides a method for manufacturing a heat sink having heat-dissipating fins capable of increasing heat-dissipating area, which includes the steps as follows.

In a step 101, a heat-conducting base 10 and a heat pipe 20 are provided.

In a step 102, the heat-conducting base 10 and the heat pipe 20 are assembled together. A portion of the heat pipe 20 is inserted into the heat-conducting base 10, while the other portion of the heat pipe 20 is exposed to the outside of the heat-conducting base 10. More specifically, the heat-absorbing section 21 of the heat pipe 20 is received in the open trough 11 of the heat-conducting base 10 and is adhered tightly to the heat-conducting base 10. The heat-releasing sections 22 of the heat pipe 20 are located on both sides of the heat-conducting base 10.

In a step 103, the heat-dissipating fins 30 are bent. The upper plate 32 is bent to be overlapped on the lower plate 31. As shown in FIGS. 1 and 2, the lengths of the lower plate 31 and the upper plate 32 after bending are not identical to each other, so that a heat-dissipating path b is formed there between. Further, the distal end of the upper plate 32 is warped and not adhered to the lower plate 31 completely so as to increase the heat-dissipating area of the heat-dissipating fin 30. However, the construction of the heat-dissipating fin 30 is not limited to the above-mentioned form. For example, the distal end of the lower plate 31 may be warped.

In a step 104, the heat-dissipating fin 30 is processed to extend laterally. A forming tool 70 is used to press the upper plate 32 and the lower plate 31 to make them respectively form an annular wall 311 and an outer annular wall 311 adhered to the inner annular wall 311. More specifically, the pressing direction of the forming tool 70 is upward from the underside of the lower plate 31. Thus, the inner annular wall 311 is formed by extending the lower plate 31, while the outer annular wall 321 is formed by extending the upper plate 32. The inner annular wall 311 is adhered to the outer annular wall 321 tightly.

In a step 105, the heat-dissipating fins 30 are assembled together. The heat pipe 20 penetrates the through-holes 33 of the heat-dissipating fins 30 successively.

In a step 106, a heat-dissipating body 40 is assembled. The heat-dissipating body 40 is adhered to the heat-conducting base 10. The extension pieces 42 of the heat-dissipating body 40 are arranged in the accommodating space c between the heat-releasing sections 22.

Figure 13:
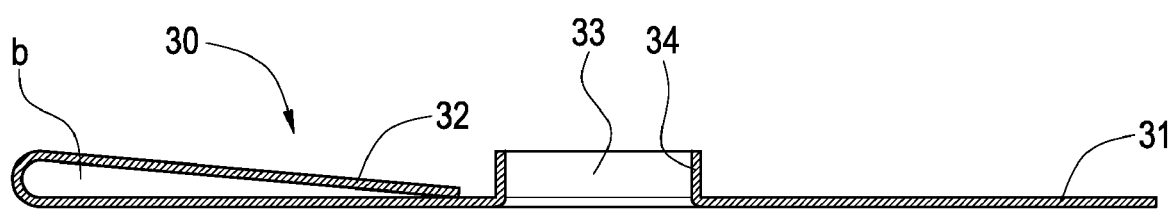
FIG. 13 is a side cross-sectional view of the heat-dissipating fin according to another embodiment of the present invention.

Please refer to FIG. 13, which is a side cross-sectional view of the heat-dissipating fin according to another embodiment of the present invention. The upper plate 32 of the heat-dissipating fin 30 is bent to be overlapped on the lower plate 31, thereby forming a heat-dissipating path b there between. In the present embodiment, the lower plate 31 is provided with a through-hole 33. The periphery of the through-hole 33 is formed with an annular wall 34, but it is not limited thereto.

Figure 14:
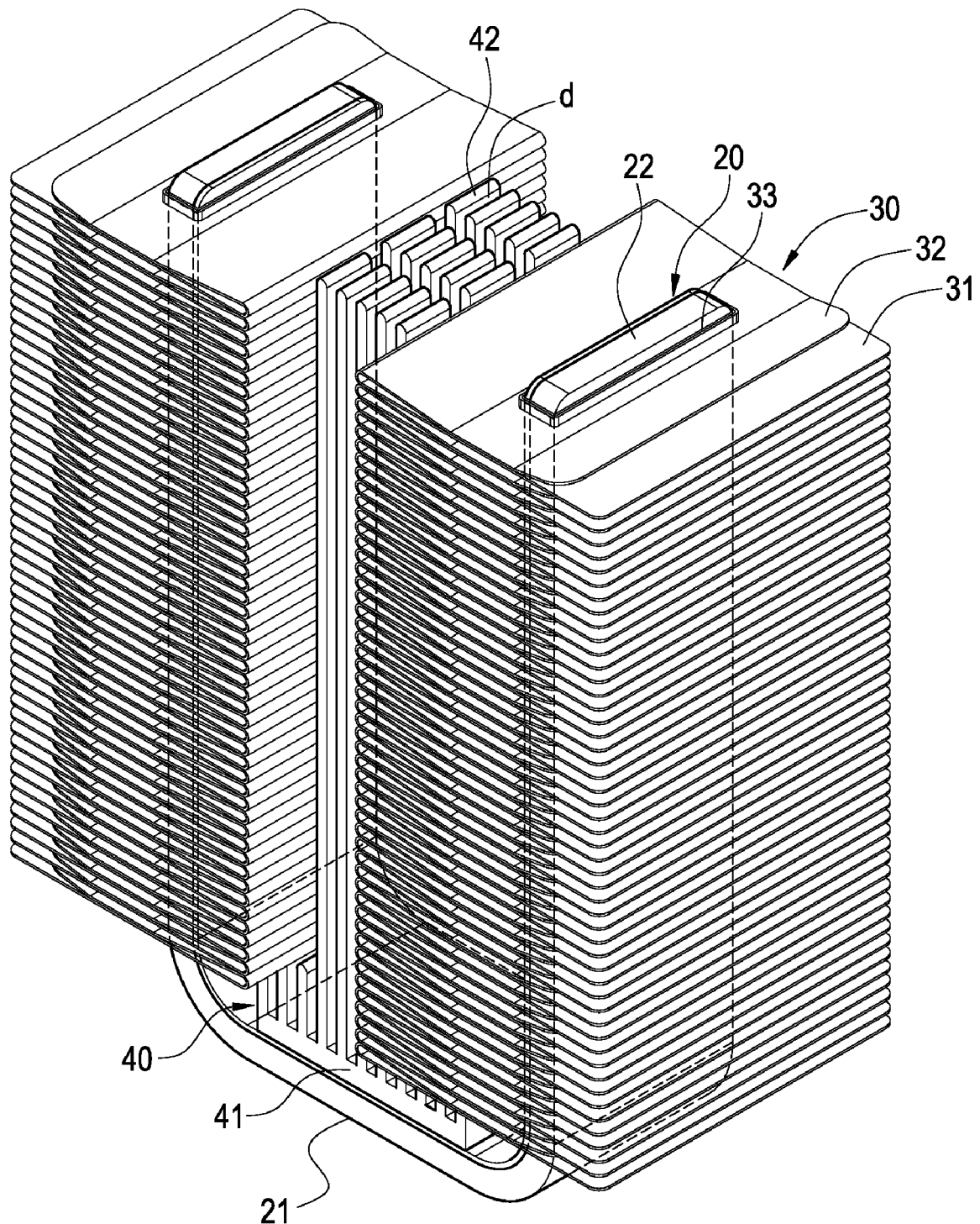
FIG. 14 is a side cross-sectional view of the heat-dissipating fin according to a further embodiment of the present invention.

Please refer to FIG. 14, which is a side cross-sectional view of the heat-dissipating fin according to a further embodiment of the present invention. In the present embodiment, the heat pipe 20 is a flat pipe. Thus, the base 41 of the heat-dissipating body 40 can be adhered to the heat-absorbing section 21 directly. The bottom surface of the heat-absorbing section 21 can be adhered to a heat-generating electronic element (not shown) directly. Therefore, the number of the components of the heat sink 1 can be reduced. Further, the heat transfer loss among the plurality of components can be thus reduced. Thus, the heat-conducting efficiency of the heat sink 1 can be guaranteed.

According to the above, the present invention demonstrates industrial applicability, novelty and inventive steps. Further, the construction of the present invention has not been seen in the products of the same kind or let in public use. Thus, the present invention conforms to the requirements for an invention patent.

What is claimed is:

1. A method for manufacturing a heat sink (1) comprising the steps of:
   providing a heat-conducting base (10) with a plurality of open troughs (11);
   providing a plurality of heat pipes (20), each having a heat-absorbing section (21) and a heat-releasing section (22) extending from the heat-absorbing section (21);
   the heat-absorbing section (21) being accommodated in one of the open troughs (11) to have the heat pipe (20) engaged with the heat-conducting base (10);
   providing a plurality of heat-dissipating fins (30), each of the heat-dissipating fins (30) having a lower plate (31) and an upper plate (32) extending from the lower plate (31), the upper plate (32) being folded to form an overlapping portion attached on the lower plate (31);
   forming a through-hole (33) in the lower plate (31) and the upper plate (32) at the overlapping portion; and
   penetrating the through-holes (33) of the heat-dissipating fins (30) by the heat-releasing section (22) of the heat pipe (20).

2. The method according to claim 1, further comprising a step of using a forming tool to press the upper plate (32) and the lower plate (31) respectively to form the through-hole (33) with an annular wall (311) and an outer annular wall (321) abuttedly surrounding the inner annular wall (311).

3. The method according to claim 2, further comprising a step of providing a heat-dissipating body (40), wherein there are two heat-releasing sections (22) formed by bending and extending from two ends of the heat-absorbing section (21) so that the heat pipe is formed in to U shape, an accommodating space is formed between the two heat-releasing sections (22) and the heat-dissipating body (40) is disposed in the accommodating space to be adhered to the heat-conducting base (10).

* * * * *